United States Patent
Hanson

[11] Patent Number: 6,060,402
[45] Date of Patent: May 9, 2000

[54] PROCESS FOR SELECTIVE RECESS ETCHING OF EPITAXIAL FIELD EFFECT TRANSISTORS WITH A NOVEL ETCH-STOP LAYER

[75] Inventor: Allen W. Hanson, Pepperell, Mass.

[73] Assignee: The Whitaker Corporation, Wilmington, Del.

[21] Appl. No.: 09/121,160

[22] Filed: Jul. 23, 1998

[51] Int. Cl.[7] .................................................. H01L 21/00
[52] U.S. Cl. ........................................ 438/745; 438/751
[58] Field of Search .................................. 438/718, 737, 438/740, 745, 751, 167, 172

[56] References Cited

U.S. PATENT DOCUMENTS

| | | | |
|---|---|---|---|
| 4,276,098 | 6/1981 | Nelson et al. .................. | 438/745 X |
| 4,738,934 | 4/1988 | Johnston, Jr. et al. ......... | 437/22 |
| 4,742,379 | 5/1988 | Yamashita et al. ............ | 357/22 |
| 4,755,858 | 7/1988 | Thompson et al. ............ | 438/745 X |
| 4,792,832 | 12/1988 | Baba et al. .................... | 357/16 |
| 4,814,847 | 3/1989 | Tabatabaie .................... | 357/30 |
| 5,021,857 | 6/1991 | Suehiro ......................... | 357/42 |
| 5,041,393 | 8/1991 | Ahrens et al. ................. | 437/58 |
| 5,270,228 | 12/1993 | Ishikawa ....................... | 437/39 |
| 5,272,109 | 12/1993 | Motoda .......................... | 437/129 |
| 5,283,448 | 2/1994 | Bayraktaroglu ............... | 257/194 |
| 5,330,932 | 7/1994 | Liu et al. ....................... | 437/133 |
| 5,372,675 | 12/1994 | Wakabayashi et al. ........ | 156/649 |
| 5,374,328 | 12/1994 | Remba et al. ................. | 156/628 |
| 5,389,574 | 2/1995 | Mizunuma ..................... | 437/184 |
| 5,420,066 | 5/1995 | Shima et al. .................. | 437/129 |
| 5,421,954 | 6/1995 | Takado et al. ................ | 156/635.1 |
| 5,445,976 | 8/1995 | Henderson et al. ........... | 437/31 |
| 5,514,605 | 5/1996 | Asai et al. ..................... | 437/40 |
| 5,521,404 | 5/1996 | Kikkawa et al. ............. | 257/194 |
| 5,739,557 | 4/1998 | O'Neil, II et al. ............ | 257/192 |
| 5,760,427 | 6/1998 | Onda ............................. | 257/194 |
| 5,786,234 | 7/1998 | Nagal et al. .................. | 438/745 X |
| 5,811,844 | 9/1998 | Kuo et al. ..................... | 257/194 |

OTHER PUBLICATIONS

Weisbuch, et al., Quantum Semiconductor Structures, 1991 by Academic Press, pp. 38–55 and pp. 141–154.

*Primary Examiner*—William Powell

[57] ABSTRACT

A process for selective recess etching of GaAs field-effect transistors. A selected etch stop layer ($In_xGa_{1-x}P$) maintains what is commonly referred to as lattice-match with the GaAs substrate material. By using this etch stop, a significant reduction in access resistances is realized with respect to devices containing other etch stop materials while an improvement in the uniformity of device characteristics across the wafer and from wafer to wafer is realized.

15 Claims, 2 Drawing Sheets

PROCESS FOR SELECTIVE RECESS ETCHING OF EPITAXIAL FIELD EFFECT TRANSISTORS WITH A NOVEL ETCH-STOP LAYER

FIELD OF THE INVENTION

The present invention is drawn to a recess etch process with selective chemistry which is advantageous in the manufacture of gallium arsenide-based epitaxial field effect transistors.

BACKGROUND OF THE INVENTION

Gallium-arsenide based field-effect transistors utilizing the depletion region formed by a metal-semiconductor junction, commonly known as Schottky junction, to modulate the conductivity of an underlying channel layer have gained acceptance as a high performance transistor technology owing to inherent physical properties of the gallium arsenide and related ternaries indium gallium arsenide. Such devices are referred to by those of ordinary skill in the art by various names such as metal semiconductor feild effect transistors (MESFET), high electron mobility transistors (HEMT), psuedomorphic high electron mobility transistor (pHEMT), two dimensional electron gas field effect transistors (TEGFET) and modulation doped field effect transistors (MODFET). Further details of the dynamics of charge transport in these structures can be found in *Quantum Semiconductor Structures* by Weisbuch, et al., 1991 by Academic Press, pages 38–55 and pages 141–154, the disclosure of which is specifically incorporated herein by reference.

In field effect transistors (FET) the current between the source and drain contacts is controlled by a potential applied to the gate electrode. The function of the device is relatively basic. In logic circuits the devices often function as switches, by virtue of the fact that the gate voltage can act as a valve in turning off current between the source and the drain in a region well-known as the channel. In analog circuits, small time-varying voltage on the gate results in a time varying current between the source and the drain, and because the gate current is ideally a pure displacement current, a very small input power can be readily amplified.

The basic gallium arsenide metal semiconductor field effect transistor known as a MESFET has the source and drain current carried via a relatively thin, highly doped, semi-conductor layer, the channel. The current is controlled by the gate which forms a Schottky barrier on the semiconductor, and therefore depending upon the applied gate voltage depletes the semiconductor layer of electrons under the gate. Other devices enumerated above to include the HEMT, pHEMT, and MODFET are based on the basic principles described above. The structure of a basic HEMT is based on the heterojunction between two dissimilar materials, AlGaAs (Aluminum Gallium Arsenide) and GaAs (Gallium Arsenide) well-known to one of ordinary skill in the art. The essential structure consists of a semi-insulating substrate on which is first grown a buffer layer of nominally unintentionally doped GaAs. An n-doped layer of gallium arsenide, or pseudomorphic indium gallium arsenide, forms the channel for the device. An $n^-$ layer of $Al_xGa_{1-x}As$ is disposed on top of the channel layer to form a proper Schottky barrier with the gate metalization. The last layer is typically a GaAs contact layer which is doped highly n-type to facilitate the formation of ohmic contacts to the underlying channel layer. The two ohmic contacts disposed on this layer are generally referred to as the source and drain contacts. Access resistances associated with these contacts and the underlying semiconductor material to the intrinsic device are typically referred to as $R_s$ and $R_d$, the source and drain resistances, respectively.

In analog applications, there are a several factors which are of prime importance. To this end, gain, noise, and total microwave output power are factors which are of prime consideration in the design of GaAs based field effect transistors. The transconductance, or gain, for an FET device is defined as the follows:

$$g_m = dI_{ds}/dVg$$

where $I_{ds}$ is the current between the drain and source, Vg is the gate voltage. Further, gm can be estimated for a high-low-high MESFET with relatively thin channel layers for example by the following expression $$g_m = \epsilon V_{sat} W_g / t$$

where $\epsilon$ is the permtivity of GaAs, $V_{sat}$ is the saturation velocity of electrons in GaAs, $w_g$ is the width of the gate electrode, and t is the gate electrode to channel spacing. For further details, see for example J. L. Walker, *High-Power GaAs FET Amplifiers*, Artech House, Boston, pp 50–56, the disclosure of which is specifically incorporated herein by reference. To first order, the speed of operation of the device makes it necessary to reduce as much as practically possible the gate length and to find structures and materials which have high average velocity of carriers under the gate. Another observation can be made from the above equation: as the layer of $n^-$ material under the gate metalization is made thinner, the gain is greater. From a simple perspective of electrostatics, the thinner the $n^-$ layer between the channel and the gate metalization is, the greater the influence of the electric field on the channel conductivity through depletion of carriers. Accordingly, by making this layer thin, for a given change in the gate voltage, a greater control is realized over carriers in the channel, and therefore a greater change in $I_{ds}$ is realized. Thus, the transconductance is greater. Additionally, the closer the gate metalization is to the channel, the lower is the pinch off voltage, or the voltage required to reduce the drain current to a negligible value.

Therefore, in brief summary, the GaAs FET structure of devices of the present disclosure functions by applying a potential to the gate to modulate to conductivity of the underlying channel and thereby to control the source-to-drain current which results from a positive potential applied from drain-to-source. The preferred structure of a highly doped channel (n), a lightly doped ($n^-$) Schottky layer and a highly doped $n^+$ contacting layer is known as a high-low-high structure. A material should be chosen to improve the velocity of carriers in a channel, so as to improve the gain of the device by the equation set forth above.

It is common that the manufacture of FET devices entails techniques to fabricate devices having performance characteristics of saturated drain-to-source current, transconductance, and pinch off voltage which are within tolerance require an iterative, single wafer-recess etch process. Such a recess etch is used to increase the transconductance of the device while simultaneously improving the breakdown voltage of the transistor as described in J. L. Walker, *High-Power GaAs FET Amplifiers*, Artech House, Boston, pp 66–72, the disclosure of which is specifically incorporated herein by reference. Specifically, proper etch depth is attained by etching a wafer, measuring the source-to-drain current, and repeating this procedure until a target value is attained. To this end, the contact layers on which the drain and source metalizations are disposed are etched down and reveal the n⁻ layer which provides the surface on which the gate electrode is subsequently disposed. This iterative procedure is labor intensive requiring a technician to measure drain-to-source current following each itteration of etch to determine if the target current has been attained. This very labor intensive process is often not reproducible in reliable manner. In addition, a certain point will be reached in the etching process where the source-to-drain current reaches an unacceptable value. This condition is referred to as overetch and results in devices which do not meet performance specifications. Additionally, such iterative processing often results in etch depth variation across the wafer and from wafer-to-wafer. This dimensional variation has a direct impact on the performance variation. For example, a 5% across-wafer variation in pinchoff voltage is often realized. The variation of this parameter across the process can typically exceed 12%. Parameter variation is defined here as standard deviation divided by average.

The use of selective chemistry to stop the recess etching process at a depth determined by the placement of the stop layer has been shown to improve the uniformity and reproducibility of the depth. The benefit of such a device is that one can control the gate-to-channel spacing to a desired level limited only by the uniformity of the process used to form the epitaxial layers. Additionally, the significant labor input can be reduced from the etch procedure as the recess etch can be performed in batch. Previous techniques to provide an etch stop have been done with materials such as AlAs, or more specifically $Al_xGa_{1-x}As$. One such technique is disclosed in U.S. Pat. No. 5,374,328 to Remba, et al., the disclosure of which is specifically incorporated by reference herein. Unfortunately, the use of such materials can have deleterious effects on devices through an increase in the device access resistances. As stated previously, access resistance is a general term used to describe what are commonly referred to in the art as the source and drain resistances. An increase in the device source resistance, for example, reduces the extrinsic transconductance of the device as described by the following relation found in many texts on semiconductor device physics (see for example S. M. Sze, *Physics of Semiconductor Devices*, John Whiley and Sons, New York, 1969, p. 355 the disclosure of which is specifically incorporated herein by reference)

$$g_{me}=g_{mi}/(1+g_{mi}R_s),$$

where $g_{me}$ is the extrinsic transconductance of the device as measured at its external terminals; $g_{mi}$ is the intrinsic transconductance or that which the device would exhibit if the source resistance were negligible; and $R_s$ is the source resistance of the device. Further, an increase in the device access resistances will increase the drain-to-source voltage at which the drain current saturates what is often referred to in the art as the knee voltage. The increased knee voltage can limit the power performance of the device. The access resistances are often described as being comprised of two primary elements, one associated with the metal-semiconductor interface, the other associated with the semiconductor material outside of the influence of the gate electrode. The insertion of an etch-stop layer into the structure adds an additional resistive component to the device access resistances. This component is associate with a tunneling barrier imposed by the offset in the minimum allowed energies of conduction electrons between the two dissimilar materials often referred to in the art as conduction band discontinuity. The greater the conduction band discontinuity, the greater the associated resistance. Reported experimental values of the conduction band discontinuity, that for the AlAs/Gas materials system is on the order of 500 meV.

Accordingly, what is needed is a device which has the improvements in device manufacturablilty which can be effected by a suitable etch-stop material while not suffering the drawbacks of increased access resistances experienced with conventional etch-stop materials.

SUMMARY OF THE INVENTION

The present invention is drawn to a process for selective recess etching of GaAs field-effect transistors. The etch-stop layer is $In_xGa_{1-x}P$, where the typical value of x is 0.5 in order to maintain what is commonly referred to as lattice-match with the GaAs substrate material. The present invention envisions the use of a relatively thin (10–30 Angstrom) layer of the $In_xGa_{1-x}P$ material to effect the selective recess etching of the material to a point where a relatively uniform thickness of n⁻ material remaining above the channel layer is realized. The technique of the process of the present invention permits implementation of batch processing which significantly reduces the process labor content. By using the material described herein for the etch stop, a significant reduction in access resistances is realized with respect to devices containing other etch stop materials, while an improvement in the uniformity of device characteristics across the wafer and from wafer to wafer are realized. Furthermore, by using the material described herein for the etch stop, a significant reduction in access resistances is realized with respect to devices containing other etch stop materials, while an improvement in the uniformity of device characteristics across the wafer and from wafer to wafer are realized.

While in the preferred embodiment the etch stop layer has the metalization for the gate electrode deposited directly thereon, in an alternative embodiment, a portion of the $In_xGa_{1-x}P$ etch stop can be removed and metalization can be effected directly on the underlying n⁻ layer. This alternative embodiment has the advantage that higher selectivities can be attained and, hence, improved uniformity in device characteristics can be realized across the wafer and from wafer to wafer. This improved selectivity occurs by virture of the availability of etch chemistries which etch $In_xGa_{1-x}P$ at a finite rate but exhibit a relatively negligible etch rate for the underlying GaAs layer or effectively an infinite selectivity. By contrast, the best selectivities realized to date for GaAs over $In_xGa_{1-x}P$ have been limited to on the order of 150. An example of such a wet chemistry is the $HCl:H_3PO_4:HCl$ system.

Accordingly, the material chosen for the etch stop layer of the present invention exhibits a selectivity with respect to etching of the contact layers for the drain and source as well as the ability to etch directly through the $In_xGa_{1-x}P$ etch stop layer to effect metalization directly on the n⁻ material. Finally, it is of interest to note that a thicker layer of etch stop material provides for a heterojunction between the etch stop layer and the n⁻ layer GaAs which would enable higher bias voltages and a greater current swing, resulting an increase in the maximum open channel current, $I_{max}$.

OBJECTS, FEATURES AND ADVANTAGES OF THE PRESENT INVENTION

It is an object of the present invention to have a process for fabricating GaAs field effect transistors uniformly across a wafer and within wafer-to-wafer tolerance defined by the epitaxial layer growth process and in batch processing.

It is a feature of the present invention to have a process which uses an etch stop layer which enables substantially uniform distances between the gate and the channel layer in devices across a wafer without degrading the device access resistance.

It is an advantage of the present invention to effect the formation of a recessed region in a device employing batch mode processes while maintaining device performance levels comparable to more labor intensive techniques.

DETAILED DESCRIPTION OF THE INVENTION

The present invention is drawn to a high-low-high gallium arsenide epitaxial field effect transistor structure. While the focus of the disclosure of the present invention will be on this special class of MESFET, it is clear that to one of ordinary skill in the art, the invention of the present disclosure has applicability to epitaxial devices in which a Schottky barrier is used to control current in a channel and the common substrate material to all such devices is GaAs. As discussed previously, significant reductions in the intensity of labor, processing time and an overall improvement in the uniformity across a given wafer can be realized by the utilization of $In_xGa_{1-x}P$ which is used as the etch-stop material in the devices of the present disclosure. To this end, a lower conduction band discontinuity between dissimilar materials translates to a lower resistance component of the overall access resistances. Reported experimental values for the conduction band discontinuity between $In_xGa_{x-1}P$ and GaAs vary between 30 and 220 meV, with the majority of the values falling between 180–220 meV. Previous attempts with other materials such as AlAs, or more generally $Al_xGa_{1-x}As$, as described above while exhibiting excellent selectivity to GaAs, result in increased access resistances as is discussed above. Accordingly, the increased access resistances have an adverse effect on parameters such as the maximum open channel current, knee voltage and transconductance. In contrast, the use of the $In_xGa_{1-x}P$ etch-stop of the invention of the present disclosure results in a lower conduction band discontinuity at the interface with the n⁻ GaAs Schottky layer and results in a lower tunneling barrier to current flow, and accordingly lower access resistances to the device. This enables the benefits of the etch-stop while maintaining the performance characteristics of devices fabricated without an etch-stop which suffer the drawbacks of nonuniformity across a wafer as described previously. However, values of x other than 0.5 may be chosen to minimize the misfit dislocation density as described in, J. W. Matthews, A. E. Blakeslee, Defects in epitaxial multilayers I. Misfit dislocations, J. Crytal Growth, vol. 27, pp. 118–125, 1974, the disclosure of which is specifically incorporated herein by reference. The range of permissible values of x will vary as a funtion of the thickness of the etch stop layer.

Figure 1:
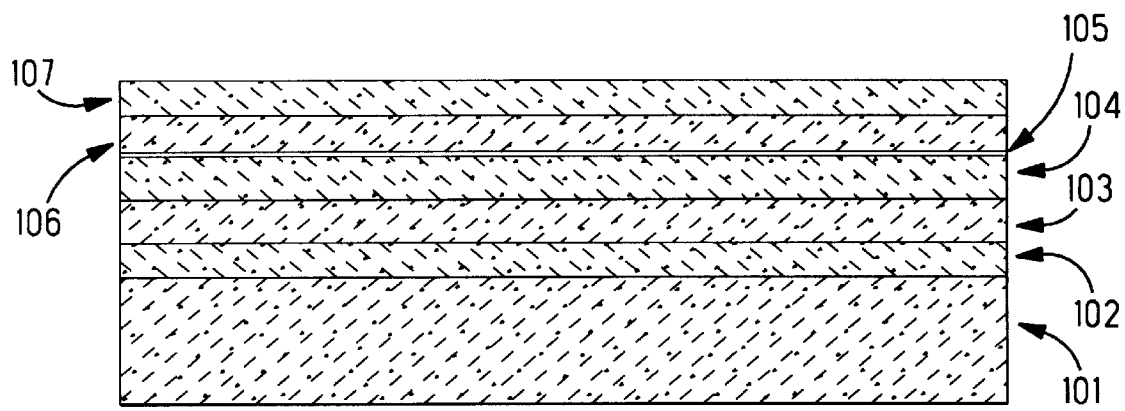
FIGS. 1–6 show the device of the present disclosure in various stages of processing, with FIG. 6 showing the salient features of the resultant device of the invention of the present disclosure.

The fabrication of the device is discussed presently. Turning to FIG. 1, the semi-insulating GaAs substrate is shown at 101. This layer has a buffer layer of unintentionally doped GaAs 102 epitaxially disposed thereon and an n-doped layer of GaAs layer 103 which is the channel layer. This layer has a doping level on the order of $3 \times 10^{17}$ cm⁻³. Disposed on top of the channel layer is the Schottky barrier layer 104 which is layer of GaAs doped lightly n-type. This layer has a doping level on the order of $5 \times 10^{16}$ cm⁻³. The Schottky barrier layer 104 has a thickness in the range of 200–1000 Angstroms with a preferred thickness on the order of 430 Angstroms. As stated above, the distance between the gate metalization and the channel layer 103 is governed by the thickness of the layer 104, and thus this layer plays an important role in device parameters described herein. The etch-stop layer of $In_xGa_{1-x}P$ is shown at 105. This layer is typically on the order of 10–40 Angstroms in thickness. One additional advantage of the use of the $In_xGa_{1-x}P$ layer is described presently. Because the metal disposed on an $In_xGa_{1-x}P$ surface exhibits a greater barrier height to the forward conduction of electrons, or what is known to one skilled in the art as the Schottky barrier height, as compared with that disposed upon a GaAs surface, so doing will result in devices with a potentially greater maximum open channel current. Returning now to FIG. 1, layer 106 is a continuation of the underlying Schottky layer 104. The primary purpose of this layer is to spatially separate the gate electrode from the highly doped layer 107 and, hence, maintain a reasonable breakdown voltage for this junction. The contact layer 107 is highly doped n+ to facilitate a good ohmic contact for the drain and source as described herein. The Schottky layer 104, on the other hand, is lightly doped to facilitate the formation of a good Schottky barrier. As described previously, the gate-to-channel spacing is chosen to realize, among other parameters, a specific pinch-off voltage $v_p$.

Figure 2:
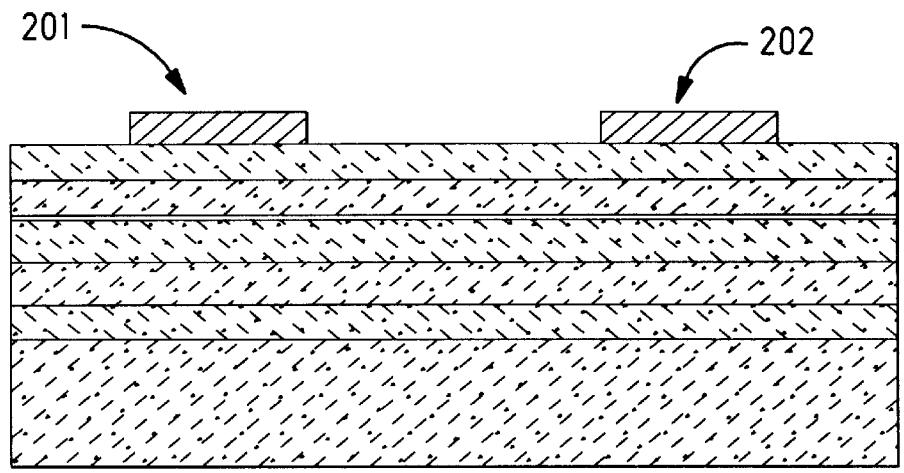
Figure 3:
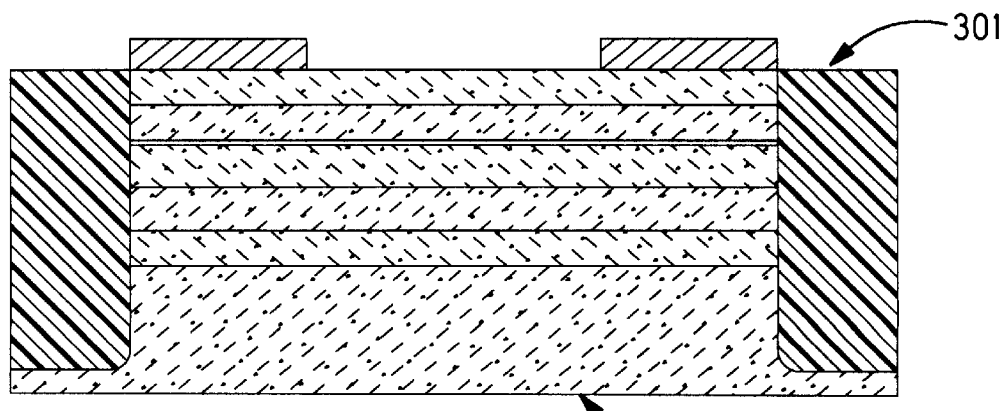

Turning to FIG. 2, ohmic contact formation is discussed. In general, the ohmic contacts are formed by defining the areas to be contacted lithographically, and then evaporating a suitable metal alloy for example AuGeNiAu followed by a subsequent lift of f step of the photoresist layer. Such processing steps are well known to one of ordinary skill in the art and the final ohmic contact is as shown at 201 for the source and 202 for the drain. FIG. 3 shows the implant isolation which is done. In order to properly isolate one device on a wafer from another device, isolation implantation is performed in regions outside of the device lateral boundaries. These are as shown at 301. The regions which are outside the active semiconductor region are rendered electrically inactive by implantation of a species such as Boron, a preferred implant material. Proton implantation (H⁺) may also be employed. This implant profile extends into the semi-insulating GaAs substrate 101 and serves to properly isolate the device. An alternative to this method, also well known to one of ordinary skill in the art, is to perform a mesa isolation, in which the required layers of the device are disposed in mesa form by etching to remove the active material from all regions outside of the device boundaries.

Figure 4:
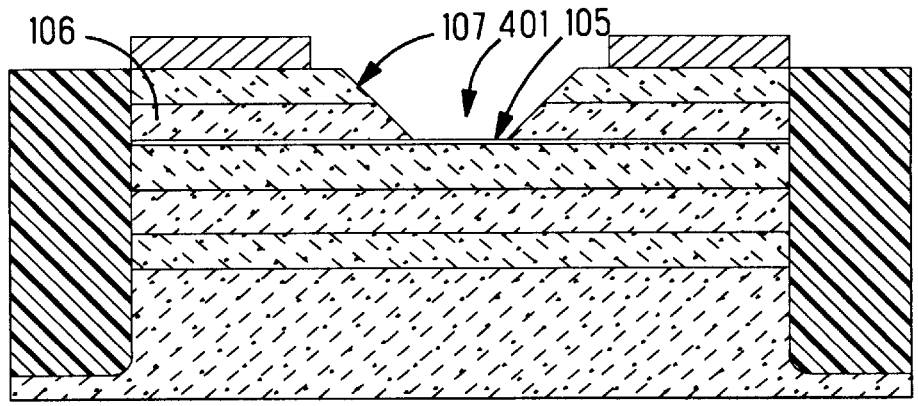

Turning to FIG. 4, the selective recess etch in the gate region is shown. This is as shown at 401. The gate region 401 is defined within an opening in a photolithographic film. This region is etched to remove the highly doped contact layer 107 and a portion of the Schottky layer, described as layer 106, prior to the deposition of the gate electrode material and is the area of primary focus in the invention of the present disclosure. With the etch-stop 105 inserted at the proper depth, a chemistry, which etches GaAs at a higher rate when compared to the $In_xGa_{1-x}P$ etch rate, is to used to form the recess. In the preferred embodiment of the present disclosure such a selective chemistry would be $H_2SO_4:H_2O_2:H_2O$ of volumetric ratio 1:8:500. For this composition of chemistry, we have determined that the GaAs etch rate is on the order of 10 Angstroms per second at room temperature and the ratio of GaAs to $In_{0.5}Ga_{0.5}P$ etch rates is on the order of 150. While it is clear that this chemistry is exemplary, it is of interest to note that other chemistries are clearly possible. To this end, the primary purpose of the etch-stop is to assure that the etching of the layers 106 and 107 proceed at a much faster rate than that of layer 105. By selecting the appropriate chemistry and thereby assuring an appropriate ratio of etch rates of the etch-stop layer 105 to that of layers 106 and 107, a relatively uniform recess etch depth is attained across the wafer. Further the across-wafer uniformity of the gate-to-channel dimension is now determined by the uniformity of epitaxial layer 104.

After the etching to the etch-stop layer is complete, the gate electrode 601 is fabricated through deposition techniques well known to one of ordinary skill in the art. Using the same lithographic layer used for recess definition, a Schottky contact is deposited and lifted off. A typical gate electrode stack might consist of—TiPtAu. Following this, the device is usually passivated with a dielectric such as silicon nitride and connected with other circuit elements with additional layers of metalization. Optionally, the proportion of the etch-stop layer 105 exposed by the lithographic film used for recess definition may be selectively removed to reveal the underlying layer 1-5 prior to gate electrode deposition. An example of a wet etch chemistry which exhibits a high $In_{0.5}Ga_{0.5}P$ etch rate to be on the order of 1 micron per min, where as no discernable GaAs etch rate has been observedis HCl. Hence the selectivity ratio is virtually infinite.

Two etch-stop thicknesses, 10 and 20 Angstroms, have been utilized, although other thicknesses in keeping with the teaching of the present invention can be used. Using a 20 Angstrom $In_xGa_{1-x}P$ layer as the etch-stop the following wafer average device parameters have been realized. $I_{max}$ of 400 mA/mm compares well to a wafer fabricated through conventional techniques. Additionally, a pinch-off voltage of −1.78 volts compares well to conventionally fabricated devices. The intrinsic transconductance of devices fabricated by the technique of the present disclosure with a 20 Angstrom etch-stop layer is on the order of 156 mS/mm is again comparable to a device fabricated by conventional techniques without an etch-stop layer. Finally, the sum of the source and drain resistances show no significant difference to devices fabricated without an etch-stop. Clearly, this is in sharp contrast to devices fabricated with epitaxy employing other materials for the etch-stop layer for which access resistances are as discussed above. It has been found that even the use of exceedingly thin layers of AlAs, on the order of 10 Angstroms thick, have resulted in an increase in the combined source and drain resistances of more than 40% relative control samples containing no such stop layer. A process figure of merit know as contact resistance has also been compared for two thicknesses of AlAs (10 and 25 Angstroms) and two thicknesses of $In_{0.5}Ga_{0.5}P$ etch stops (10 and 20 Angstroms) with samples containing no etch stop layers. The AlAs samples exhibited 0.3 and 0.8 Ohm-mm for the 10 and 25 Angstrom case respectively as compared with 0.1 Ohm-mm for the control samples. The difference in value is attributable to a reduction in electron tunneling probability associated with the relatively large conduction band discontinuity at the AlAs/GaAs interfaces. For the $In_{0.5}Ga_{0.5}P$ case, no significant difference was observed between samples, including the control samples, with all exhibiting contact resistances on the order of 0.15 Ohm-mm. The latter experiment suggests that $In_{0.5}Ga_{0.5}P$ etch stop layers as thick as 20 Anstroms do not present an additional parasitic resistive element when compared to the parasitic resistive elements of the control sample devices which do not use the etch stop layer of the present invention.

Figure 5:
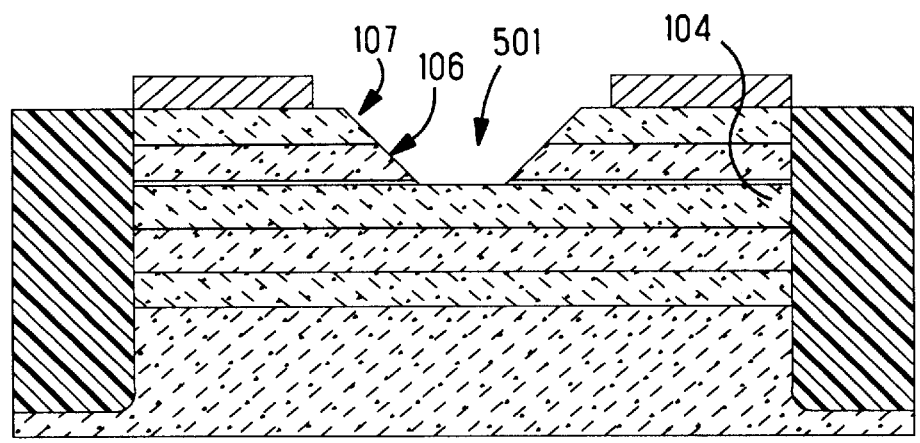
Figure 6:
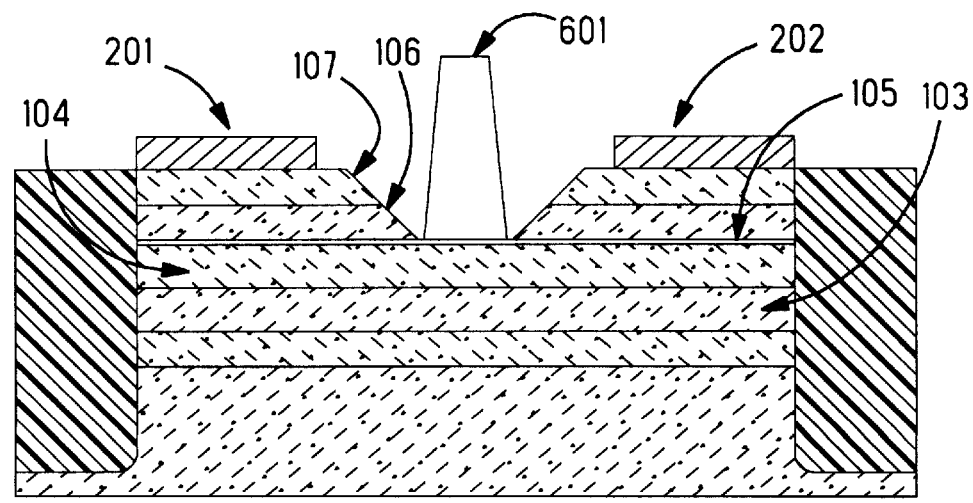

Finally, an alternative embodiment of the present disclosure is shown at FIG. 5. To this end, the $In_xGa_{1-x}P$ layer can be removed by highly selective chemistries. This region 501 has the $In_xGa_{1-x}P$ layer removed, for example, by HCl. This alternative embodiment has certain advantages with respect to higher selectivity, hence, greater uniformity in etch depth.

By virtue of the use of the $In_xGa_{1-x}P$ etch-stop layer, improvements in across wafer parameter variation is similar to that attained with wafers containing AlAs etch-stop layer. However, as discussed above, the combined access resistances ($R_s+R_d$) for the modified devices compares well with devices fabricated without an etch-stop layer. This is in contrast with devices fabricated with other etch-stop layers to include AlAs and $Al_xGa_{1-x}As$ where a significant increase in the access resistances is realized which compromises the extrinsic transconductance of devices fabricate with such material.

With the invention having been described in detail, it is clear that variations and modifications are within the purview of one of ordinary skill in the art. To this end, the invention of the present disclosure is drawn to an etch-stop layer which enables an improvement in across-wafer parameter uniformity by virtue of a uniform recess depth, without the deleterious effect on the device access resistances associated with more conventional etch-stop layers. To the extent that other materials and chemistries for etching such materials are within the purview of the artisan of ordinary skill, such within the scope of the presentinvention.

I claim:

1. A process for fabricating a semiconductor device, the process comprising:

growing an n-channel layer of GaAs on a buffer layer; growing a Schottky layer on said channel layer; epitaxially growing an etch-stop layer on said Schottky layer; growing first and second layers of GaAs on said etch-stop layer, said second layer being a highly doped contact layer; and selectively etching portions of said first and said second layers to form a gate region, said first and said second layers having a first etch rate, and said etch stop layer having a second etch rate in a chosen etch chemistry, with a ratio of said said first etch rate to said second etch rate being on the order of about 150.

2. A process as recited in claim 1, wherein said etch stop layer is $In_xGa_{1-x}P$ where x varies as a function of the thickness of said etch stop layer.

3. A process as recited in claim 2, wherein $0.4 \leq x \leq 0.6$.

4. A process as recited in claim 1, wherein said etch chemistry is $H_2SO_4:H_2O_2:H_2O$.

5. A process as recited in claim 1, wherein a gate metal layer is deposited in said gate region.

6. A process as recited in claim 2, wherein said etch-stop layer has a thickness on the order of 10–40 Angstroms.

7. A process as recited in claim 1, further comprising opening a window in said etch stop layer via a second etch chemistry and depositing a gate metal layer therein, said gate metal making electrical contact with said Schottky layer.

8. A process as recited in claim 7, wherein said second etch chemistry is $HCl:H_3PO_4:HCl$.

9. A process for fabricating a field-effect transistor, the process comprising:

growing an epitaxial buffer layer of unintentionally doped GaAs on a GaAs substrate;
growing an epitaxial n-channel layer on said buffer layer;

growing a Schottky layer on said n-channel layer;

growing an $In_xGa_{1-x}P$ etch-stop layer on said n-channel layer where x varies as a function of the thickness of said etch stop layer;

growing first and second layers of GaAs on said etch-stop layer; and selectively etching said first and second layers to form a recess in said first and second layers, said selective etching effected with an etch chemistry, said etch chemistry etching said first and second layers at a rate on the order of 150 times faster than said etch chemistry etches said etch-stop layer.

10. A process as recited in claim 9, wherein $0.4 \leq x \leq 0.6$.

11. A process as recited in claim 9, wherein said etch chemistry is $H_2SO_4:H_2O_2:H_2O$.

12. A process as recited in claim 9, wherein a gate metal layer is deposited in said gate region.

13. A process as recited in claim 9, wherein said etch-stop layer has a thickness on the order of 10–40 Angstroms.

14. A process as recited in claim 9, further comprising opening a window in said etch stop layer via a second etch chemistry and depositing a gate metal layer therein, said gate metal making electrical contact with said Schottky layer.

15. A process as recited in claim 14, wherein said second etch chemistry is $HCl:H_3PO_4:HCl$.

* * * * *